(12) United States Patent
Cutter

(10) Patent No.: US 6,724,093 B2
(45) Date of Patent: Apr. 20, 2004

(54) SEMICONDUCTOR DEVICES AND THEIR MANUFACTURE

(75) Inventor: John R. Cutter, Macclesfield (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/912,142

(22) Filed: Jul. 24, 2001

(65) Prior Publication Data
US 2002/0008327 A1 Jan. 24, 2002

(30) Foreign Application Priority Data
Jul. 24, 2000 (GB) .............................. 0018028

(51) Int. Cl.[7] .................. H01L 23/48; H01L 23/29
(52) U.S. Cl. ............... 257/788; 257/747; 257/795; 257/791; 257/794
(58) Field of Search .................. 257/747, 788, 257/795, 791, 794

(56) References Cited

U.S. PATENT DOCUMENTS

| | | | |
|---|---|---|---|
| 4,206,472 A | * 6/1980 | Chu et al. ............. | 357/67 |
| 4,929,884 A | 5/1990 | Bird et al. ............. | 323/313 |
| 5,600,151 A | * 2/1997 | Adachi et al. ......... | 257/40 |
| 6,075,289 A | 6/2000 | Distefano | |

FOREIGN PATENT DOCUMENTS

| | | | |
|---|---|---|---|
| GB | 004201792 A1 | * | 8/1992 |
| JP | 428254 A | | 1/1992 |
| WO | 9702592 A2 | | 1/1997 |
| WO | 0062422 A1 | | 10/2000 |

* cited by examiner

Primary Examiner—George Eckert
Assistant Examiner—Joseph Nguyen
(74) Attorney, Agent, or Firm—Aaron Waxler

(57) ABSTRACT

Thermal cycling can lead to damaging stress at the upper surface of a semiconductor device chip (10) encapsulated in synthetic resin material (100), particularly in the case of power devices that include an IC. The invention provides a thick ductile layer pattern (50) of, for example, aluminium over most of the top surface of the insulating over-layer (40) of the chip (10). Electrically-isolated parts (50a, 50b, 50c, 50d etc.) of this ductile covering are individually connected to respective underlying conductive areas so as to reduce charging effects across the insulating over-layer (40). A sufficient spacing Z1 is present between these isolated parts (50a, 50b, 50c, 50d etc.) to avoid short circuits as a result of deformation by shearing and smearing during thermal cycling of the device. The ductile metal layer pattern (50) reduces stress between the insulating material (40) and the plastic material (100), but it can be both easily and cheaply applied in device manufacture before dividing the wafer into individual chips.

14 Claims, 3 Drawing Sheets

SEMICONDUCTOR DEVICES AND THEIR MANUFACTURE

BACKGROUND AND SUMMARY OF THE INVENTION

This invention relates to semiconductor devices comprising a semiconductor device body encapsulated in an envelope of synthetic resin material, particularly but not exclusively power devices that include an integrated circuit (herein termed "IC") in the device body. The invention also relates to their advantageous manufacture. The device body is often termed "chip".

TECHNICAL FIELD

In power ICs with fine dimensions and in power devices with integrated control circuitry (so-called "Smart Power" devices), the top surface of the chip may be highly corrugated (at least locally) from a topography of fine metal lines that run over the chip. These metal lines are part of a pattern of conductive connections present on (and at windows in) an insulating layer at that surface of the chip. Typically the metal lines are narrow (e.g. one to five micrometers wide), but they may be quite thick (e.g. one to five micrometers) so as to provide low electrical resistance and freedom from electro-migration effects. Particular examples of such power devices are disclosed in United States patent specification U.S. Pat. No. 4,929,884 (our ref. PHB33363) and more recent, published PCT patent application WO-A-00/62422 (our ref. PHB34338), the whole contents of which are hereby incorporated herein as reference material.

Usually the chip is covered by an insulating over-layer (sometimes called a "glass-over") of a dielectric material such as silicon nitride or oxide or a polyimide. These layers are typically brittle. The insulating over-layer extends over the pattern of conductive connections and protects the chip from the ingress of contaminants such as water and sodium. Metal bond pads are connected to appropriate ones of the conductive connections, at windows in the over-layer. Terminal conductors (such as the terminal leads of a lead-frame of the device) are connected to the metal bond pads within the envelope, for example by wire-bonding. When assembled into a hard plastic package (an envelope of synthetic resin material), the plastic material normally adheres well to the insulating over-layer, because such synthetic resin compounds are designed to have high adhesion and to provide a good seal.

The plastic material, bulk semiconductor material and lead-frame material expand and contract to differing degrees during thermal cycling in operation of the device, or when the device is cycled between temperatures on a reliability test or simulated application test. The differential expansion and contraction give rise to high stress in the package. This stress is particularly high at the plastic to chip interface, where it can lead to cracking of the insulating over-layer and to distortion and/or shifting of the metal lines.

The top metal of the conductive connections and of the bond pads is often aluminium with a small amount of Si or Cu added. It is quite soft and can be detached and/or distorted (smeared) by the stress. The insulating over-layer is generally a rigid layer that cannot be deformed; it reacts to the stress by cracking.

The cracking of the insulating over-layer can result in contamination of the chip by the ingress of, for example, water and sodium that degrade the electrical stability of the chip. The stress effects on the conductive connections can lead to an effect sometimes called "Pattern Shift", in which electrical failure can even occur by short-circuiting or open-circuiting of the metal connections. The corrugation of the chip surface exacerbates the problem, as it allows a good keying of the plastic material to the insulating over-layer. The problem is often most severe towards the corners of the chip.

In order to protect the metal connections of an integrated circuit device against such damage due to stress, published Japanese patent application Kokai JP-A-04-28254 proposes covering the insulating over-layer with a thick layer of ductile metal (aluminium). The whole contents of JP-A-04-28254 are hereby incorporated herein as reference material. This thick aluminium layer of JP-A-04-28254 provides an interface with the synthetic resin material that reduces stress between the insulating material and the synthetic resin material during thermal cycling of the device. The layer is provided everywhere on the insulating over-layer, regardless of the nature of the underlying device elements, and it is absent from the bond pad areas of the device. The present inventor finds that this layer provision can be incompatible with some device structures and can be significantly improved.

It is an aim of the present invention to reduce stress between the insulating over-layer and the synthetic resin material of the package/envelope during thermal cycling of the device, and to reduce the effect of the stress on the underlying conductive connections. It is a further aim of the invention to provide an appropriate novel interface between these insulating and synthetic resin materials, having regard to the electrical properties of the underlying conductive pattern and its insulating over-layer.

According to the present invention, there is provided a semiconductor device comprising a semiconductor device body encapsulated in an envelope of synthetic resin material, wherein the device body is provided at its upper surface with a ductile layer pattern over most of the surface area of the insulating over-layer of the body. This ductile covering provides a yielding interface that reduces stress between the insulating material and the plastic material during thermal cycling of the device. In accordance with the invention, the ductile layer is provided in a pattern of laterally separate parts that are electrically isolated from each other. This electrical isolation permits the ductile layer pattern to be arranged in an electrically compatible manner with the electrical potentials (that occur in operation of the device) at the underlying areas of the conductive pattern and its insulating over-layer. A number of the electrically-isolated parts of the ductile metal layer pattern may even form metal bond pads of the device, for example at windows in the insulating over-layer. The spacing of the electrically-isolated parts of the pattern is sufficient to avoid a short circuit there-between as a result of the lateral deformation of the ductile metal during thermal cycling.

Such a semiconductor device in accordance with the invention may have the features as set out in claim 1. Particular preferred features are set out in the remaining claims. In a particularly convenient and simple form, a single patterned layer of deposited aluminium (or aluminium alloy) may provide the interface in accordance with the invention.

The ductile metal layer pattern acts like a soft covering to protect the vulnerable features underneath. Although distorted during cyclic stress, it can readily deform and thereby accommodate movement without any failure of the active regions underneath. For this reason, it is generally advantageous for the ductile metal to be thicker than height variations in the underlying surface of the insulating over-layer.

Such a ductile interface can be particularly advantageous over an IC area of a power device, where the insulating over-layer is corrugated by extending over connection tracks of the conductive pattern. Thus, the IC area can be protected from the effects of thermal stress by covering its insulating top area with one or more parts of the ductile layer pattern. Another part of the ductile layer pattern can be associated with another part of the device, for example a power dissipation area of the chip. When the device comprises a capacitor, one or more of the capacitor plates can be a sizeable metal area. In this case, it is advantageous for at least one of the electrically-isolated parts of the ductile metal layer pattern to extend on and/or form an upper plate of the capacitor.

Thus, it is a particularly advantageous feature of the invention that the ductile metal layer pattern comprises electrically-isolated parts that are appropriately spaced from each other on the insulating over-layer. As the underlying conductive areas of the device are generally at different potentials to each other, it is advantageous to connect one or more of the electrically-isolated parts of the layer pattern individually to an appropriate potential (for example, of a respective underlying conductive area) so as to reduce charging effects across the insulating over-layer. These electrically-isolated parts can be readily spaced sufficiently from each other to avoid a short circuit between the electrically-isolated parts as a result of lateral deformation (shearing and smearing) of the ductile metal during thermal cycling of the device.

Standard device processing can be used to form this ductile metal pattern in a high-volume manufacturing context. Thus, the metal layer can be both easily and cheaply applied to a semiconductor wafer before dividing the wafer into individual chips. Standard deposition and etching technologies may be used. The same deposited layer may even be patterned to provide also the bond pads of each chip, and so no additional processing steps may be necessary. These are potentially important manufacturing process aspects of the present invention.

BRIEF DESCRIPTION OF THE DRAWINGS

These and other advantageous features in accordance with the invention are included in embodiments of the present invention that are now described, by way of example, with reference to the accompanying diagrammatic drawings, in which.

Figure 1:
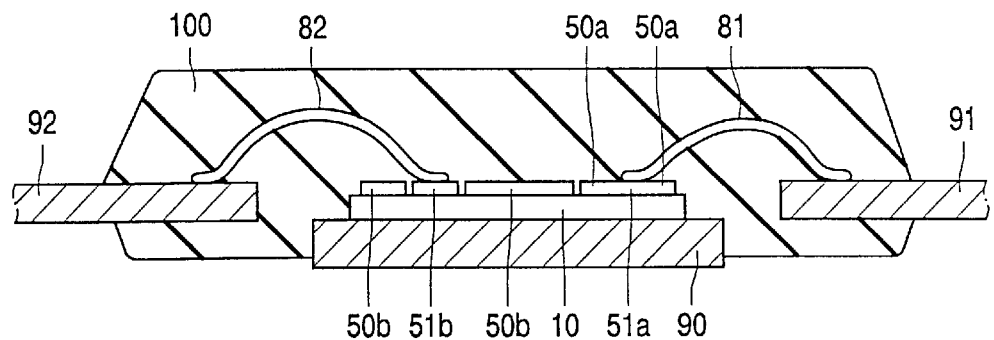
FIG. 1 is a cross-sectional view of an encapsulated semiconductor device that includes a ductile metal layer pattern in accordance with the invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

FIG. 1 illustrates an exemplary embodiment of a power semiconductor device comprising a chip 10 encapsulated in an envelope of synthetic resin material 100. When cured, the material 100 is a hard plastic. Terminal conductors 91 and 92 of the device are connected to metal bond pads 51 of the chip 10 by, for example, bond wires 81 and 82 within the envelope 100. Typically the conductors 91 and 92 may be terminal leads of a conventional lead-frame 90,91,92. The bond pads 51 are typically of aluminium or an aluminium alloy. FIG. 1 simply illustrates just two such bond pads 51a and 51b, with terminal connections 51a,81,91 and 51b,82, 92. However, the device may often comprise more such terminal connections, as will be illustrated with reference to FIG. 2. An advantageous arrangement involving the bond pads will then be described.

Figure 2:
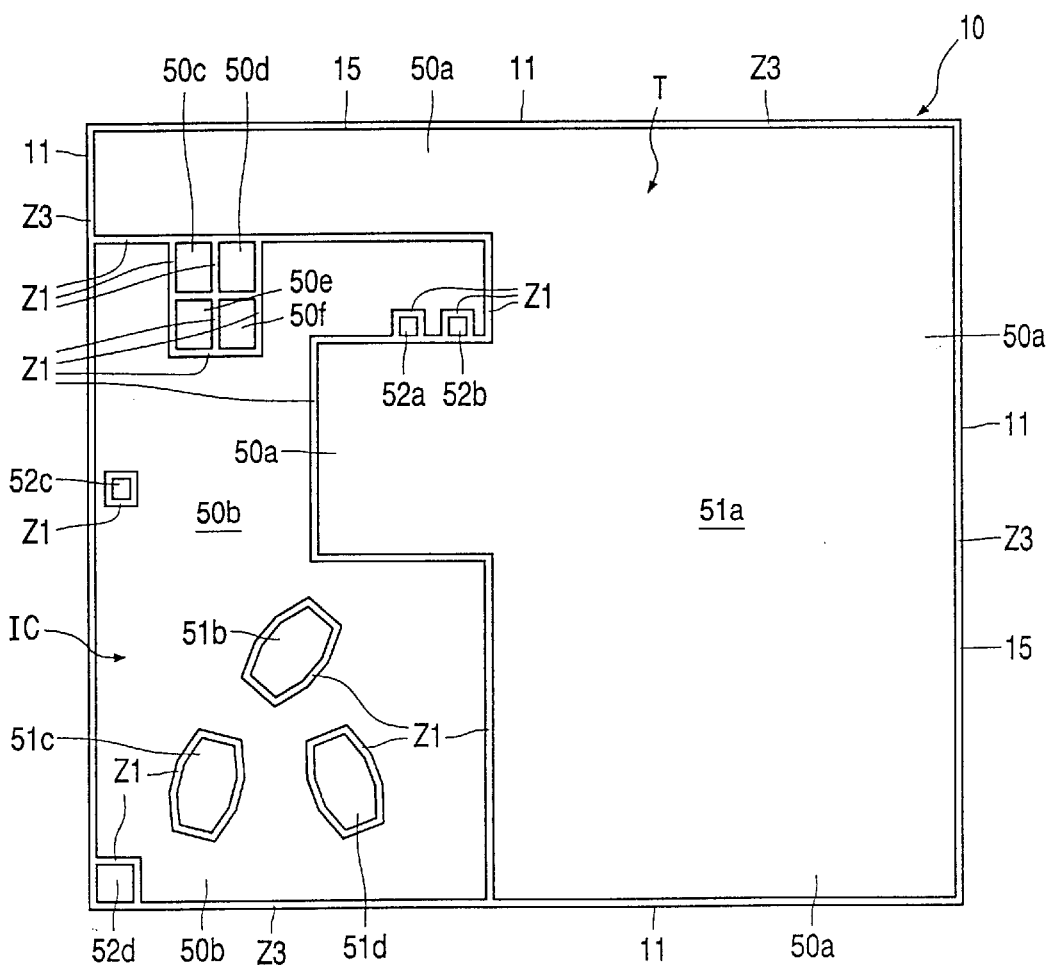
FIG. 2 is a schematic plan view of one particular example of the upper surface of the chip of such a device in accordance with the invention.
Figure 3:
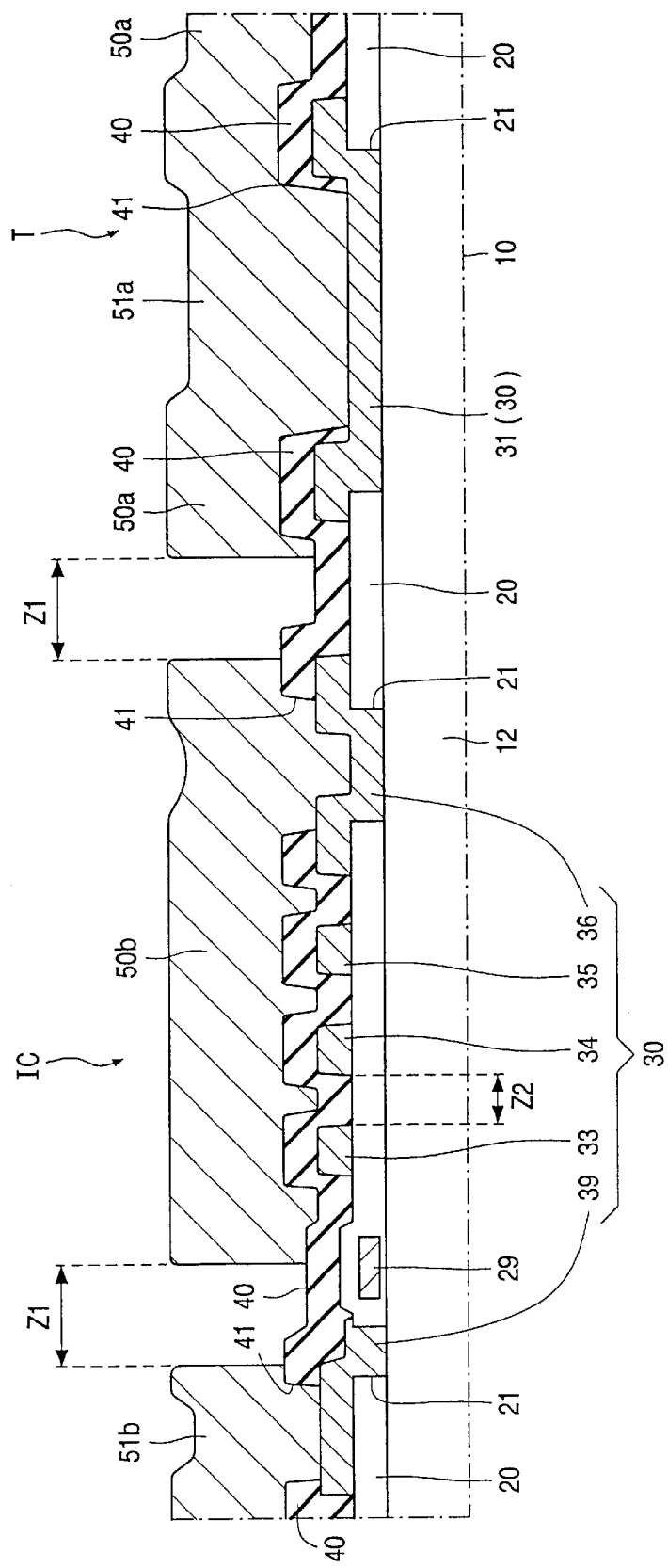
FIG. 3 is a cross-sectional view of a central part of the chip of FIG. 2, showing an arrangement of upper layers on the chip in accordance with the invention.

The device comprises a power dissipation area (a cellular power transistor T) and an IC area. FIGS. 2 and 3 show one specific example of how the power transistor T and its control circuit IC are integrated in and on the chip 10. Typically, the semiconductive bulk 12 of the chip 10 is of monocrystalline silicon. Its semiconductor regions are not illustrated because they take a wide variety of forms in different device technologies. The power transistor T may comprise tens of thousands of parallel cells. The device elements in the chip 10 may be formed in any known device technology, either MOS or bipolar. Thus, for example, the power transistor cells may be of a so-called "vertical DMOST" structure as disclosed in United States patent specification U.S. Pat. No. 4,929,884 (our ref. PHB33363), or they may be of a trench-gate vertical MOST structure as disclosed in the more recent WO patent application PCT/EP00/03045 (our ref. PHB34338). The integrated circuitry may be formed with lateral MOS transistors, as disclosed in these two references. In each case, there is an insulating layer 20 (typically comprising silicon dioxide) at the top silicon surface of the chip, i.e. over the underlying region structure (not illustrated) of the transistor and IC in the silicon bulk 12.

Figure 4:
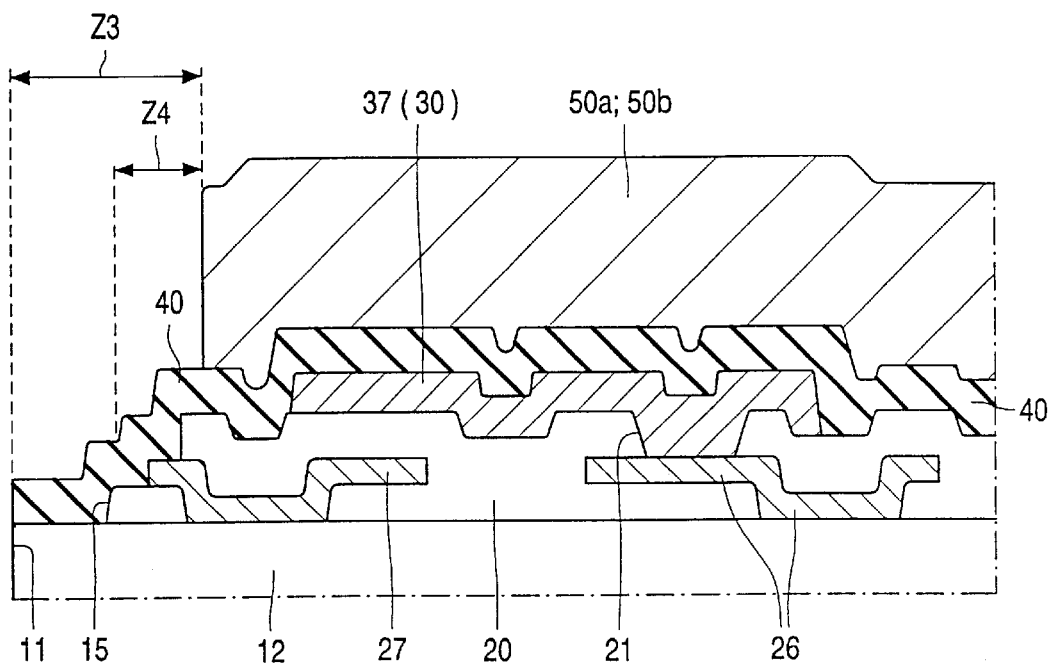
FIG. 4 is a cross-sectional view of a peripheral part of the chip of FIG. 2, showing an arrangement of upper layers on the chip in accordance with the invention.
Figure 5:
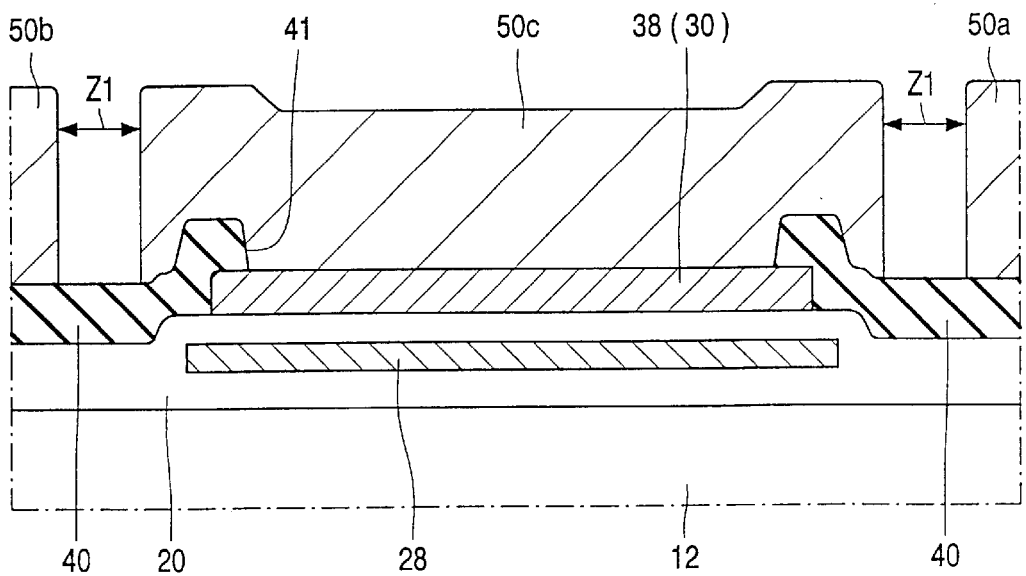
FIG. 5 is a cross-sectional view of a capacitor part of the chip of FIG. 2, showing an arrangement of upper layers on the chip in accordance with the invention.

As usual in such devices, a pattern 30 of conductive connections 31 to 39 is present on the insulating layer 20 and at windows 21 in the insulating layer 20, see FIGS. 3 to 5. These connections 31 to 39 are formed by depositing and patterning a metal film typically of aluminium or an alloy of aluminium with Si and/or Cu. When adopting device structures such as those disclosed in the two references, these connections 31 to 39 typically include the source electrode 31 and gate connection 32 (not shown) for the vertical power transistor T and source, drain and gate connections (such as the illustrated connection 39) for the lateral IC transistors. Via windows 21 in the insulating layer 20, these aluminium connections contact the underlying semiconductor transistor regions in the chip and then extend as connection tracks (such as metal lines 33 to 36) on the insulating layer 20. Some of these aluminium connections also contact gate electrodes 29 that are embedded within the insulating layer 20, i.e. the layer 20 may typically be a known composite of superimposed insulating layers. Known device layout schemes also normally include a thicker part (field-oxide) of this insulating layer 20 at peripheral areas. Examples of a thicker layer part 20 are illustrated in FIGS. 4 and 5.

The layout and fabrication of the chip 10 up to and including an insulating over-layer 40 (now to be described) can be carried out in known manner and with usual technologies.

An over-layer 40 of insulating material (sometimes called a "glass-over") is provided over the pattern 30 of conductive connections 31 to 39, as indicated in FIGS. 3 to 5. This layer 40 typically comprises a dielectric such as silicon nitride and/or silicon dioxide or and/or polyimide, and it protects the chip 10 in known manner from the ingress of contaminants. There are windows 41 in this over-layer 40, e.g. for terminal connections to the pattern 30 of conductive connections. FIGS. 1 and 3 show two metal bond pads 51a and 51b, that are also shown in the FIG. 2 layout together with another two bond pads 51c and 51d. It will be evident that other semiconductor devices in accordance with the invention may have a chip 10 with a larger or smaller number of bond pads and terminal connections. The area of the bond pad to which the terminal wire (such as 81 and 82) or other type of terminal connection is bonded may be located at the window 41 and/or on the layer 40.

As illustrated in FIG. 3, for example, the surface of the insulating over-layer 40 may be quite corrugated from the underlying metal pattern 30, and particularly where the over-layer 40 covers fine metal tracks 33 to 36 such as transistor interconnections of the IC. These IC connections and tracks are typically quite narrow, for example two micrometers wide, with a lateral minimum spacing Z2 of, for example 2 to 3 micrometers between adjacent tracks and/or connections. However, they may be quite thick, for example at least one micrometer, in order to provide low electrical resistance and to avoid excessive electro-migration effects. The plastic compound 100 of the device envelope normally adheres well to the insulating over-layer 40, as such compounds are designed to have high adhesion and to provide a good seal. Keying of the plastic 100 to the over-layer 40 would also aid the adhesion in any areas where the plastic 100 adjoins a corrugated surface of the over-layer 40.

During operation, the device experiences temperature cycling as the power transistor is switched on and off. The chip 10 and hard plastic material 100 may typically experience temperature changes from −55° C. to +150° C. The reliability of the device when cycled between such temperatures is usually tested in a simulated application test or on a reliability test such as a "Thermal Fatigue" test or a "Temperature Cycling" test. During temperature cycling, the plastic material 100, and the materials of the semiconductor body material 10 and lead-frame 90,91,92 expand and contract to differing degrees, that (in the absence of the present invention) give rise to high stress in the package. This stress is reduced in accordance with the present invention by providing a layer pattern 50 of ductile metal at the plastic to chip interface, where the stress would otherwise be particular high.

This stress-reducing layer pattern 50 is illustrated in FIGS. 1 to 5. It may be formed conveniently as a single patterned layer of aluminium or aluminium alloy. Typically, the layer 50 has a thickness of, for example, between 2 micrometers and 5 micrometers. It is preferably thicker than height variations in an underlying corrugated surface of the insulating over-layer 40, for example over the tracks 33 to 36. In these circumstances a shear stress in the ductile layer 50 will have less effect on the insulating over-layer 40 and the underlying conductor pattern 30, because movement and deformation of the layer 50 can occur above the level of the insulating over-layer 40. Thus, preferably, the patterned layer 50 is at least 2.5 micrometers thick. With this movement and deformation in mind, the minimum spacing Z1 between the distinct parts of the layer pattern 50 is determined in accordance with this thickness.

The ductile metal layer pattern 50 covers at least most of the surface area of the over-layer 40 outside the areas of the metal bond pads 51 and similar areas 52 (see FIG. 2) and outside the scribe lane 15 (see FIG. 4). Such a covering 50 provides a ductile interface with the plastic material 100 that reduces stress between the insulating material of the layer 40 and the plastic material 100 during thermal cycling of the device. All stress-vulnerable areas at the upper surface of the chip 10 are covered with areas of the thick ductile layer pattern 50. As a result, the ductile metal layer pattern 50 may typically cover at least 90% of the surface area of the over-layer 40, at least outside the areas of the metal bond pads 51. The actual optimum percentage for any particular device varies with the size of the chip 10, its topography and the envelope geometry.

Particularly stress-vulnerable areas of the chip 10 comprise the IC area that is covered by the layer parts 50b, 50c, 50d, 50e, 50f in FIGS. 2 and 3. Another stress-vulnerable area is the edge termination structure of the chip, as will be described with reference to FIG. 5. Stress reduction over the edge of the main-electrode (source) window 21 of the main power dissipation area can also be advantageous. Preferably, the metal bond pads 51 and other top metal areas (such as smaller test pads 52 in FIG. 2) are formed of the same material as the ductile metal layer pattern 50. Thus, the top metal pattern 50 to 52 on the chip 10 can be formed by etching from a common thick layer of aluminium or aluminium alloy deposited on the insulating over-layer 40. This common top metal pattern 50 to 52 of the ductile material is not only convenient for manufacture, but it also provides a more uniform pattern of stress reduction at the upper surface of the chip 10 at its interface with the plastics material 100.

The layer pattern 50 covers and protects the insulating over-layer 40 on top of the chip 10. It is not electrically functional but acts like a soft covering to protect the vulnerable features underneath. This soft layer pattern 50 is distorted during the cyclic stress, but it can readily deform and thereby accommodate the movement without any failure of the underlying insulating over-layer 40 and conductor pattern 30.

Thus, the insulating over-layer 40 is a rigid layer that cannot be deformed, but it would react to the stress by cracking. The ductile nature of the layer pattern 50 avoids such excessive stress in the layer 40 and so avoids cracking. The conductor pattern 30 of an aluminium alloy is quite soft and can be smeared and distorted by stress. This could cause so-called "pattern shift" in the conductor tracks (such as tracks 33 to 36), that results in open-circuiting of some of tracks and short-circuiting of others of the tracks (by smearing across the spacing Z2). The ductile nature of the top layer pattern 50 avoids transmission of such excessive stress via the layer 40 to the conductor pattern 30 and so avoids these problems.

The top metal layer pattern 50 is so ductile that some lateral movement can occur on the over-layer 40 during thermal cycling of the device, and so some distortion of the pattern 50 can occur by shearing and smearing. However, the minimum lateral spacing Z1 of the electrically-isolated areas (metal areas 50a to 50f, bond pads 51, and other metal areas 52) is sufficient to avoid a short circuit as a result of the lateral distortion of the ductile metal. An increase in the minimum spacing Z1 is needed with increase in the thickness of the layer pattern 50. Typically, the lateral spacing Z1 of the ductile metal areas is in the range of 10 to 30 micrometers, i.e. an order of magnitude larger than the minimum spacing Z2 in the underlying conductor pattern 30. In a particular example of the FIG. 2 layout of the layer pattern 50 with a thickness of 3 micrometers, Z1 may be at least 15 micrometers in the device before thermal cycling.

Although at least most parts of the ductile metal layer pattern 50 are not electrically active, they are preferably connected to a convenient potential to avoid any charging effects across the insulating over-layer 40. Because the underlying conductive areas are at quite different potentials, it is advantageous for electrically isolated parts (such as parts 50a, 50b, 50c etc.) of the ductile metal layer pattern to be individually connected to respective underlying conductive areas. As mentioned above, it is also advantageous to form the bond pads 51 and other metal areas 52 as electrically isolated parts of the same thick ductile layer.

In the example shown in FIGS. 2 and 3, the ductile part 50b that overlies most of the IC area is connected to a conductor part 36, and thereby (in the specific example shown) to the potential of a semiconductor portion of the silicon bulk 12. This can be particularly beneficial in providing a Faraday screen for the IC area in the case of the low-voltage circuitry of a so-called high-side device as disclosed in U.S. Pat. No. 4,929,884. A screening structure including such a part of the thick ductile metal pattern 50 of the present invention may be adopted as an advantageous modification of the Faraday screen disclosed for a temperature sensor in published PCT patent application WO-A-97/022592 (our ref. PHB33990). Thus, the device of FIGS. 1 and 2 may include such a screened thin-film temperature sensor as disclosed in WO-A-97/022592, the whole contents of which are hereby incorporated herein as reference material.

Also, in example of FIGS. 2 and 3, the ductile part 50a that overlies parts of the power transistor T is integral with the source pad 51a and so is connected to the source electrode 31 and thereby to the source regions of the cellular power transistor. As a result of this connection, the part 50a is at the load potential in a typical high-side circuit application of the device, or at ground potential in a typical low-side application.

FIG. 5 shows a ductile layer part 50c that overlies a capacitor 38-20-28 of the IC. There are four such capacitors illustrated in the layout of FIG. 2, each with its own overlying part 50c, 50d, 50e, 50f of the thick aluminium layer pattern 50. The capacitor could be completely overlaid with the insulating over-layer 40, but this arrangement would provide a large-area part 38 of the conductor pattern 30 below the over-layer 40, which risks an unnecessary increase in stress. So as to avoid this unnecessary stress, a window 41 is present in the over-layer 40 at most of the area of the capacitor where the part 38 forms an upper plate of the capacitor. An electrically-isolated part (respectively 50c, 50d, 50e and 50f for the four individual capacitors) of the ductile metal layer pattern 50 extends on the upper plate 38 of the capacitor at this window 41 in the over-layer 40, and so is connected to the potential of the upper plate 38.

FIG. 4 illustrates the application of the invention to one known example of a perimeter termination structure 26,27 in the vicinity of the periphery 11 of the chip 10. In this particular example, the termination structure includes an outwardly-directed field-plate 26 surrounded laterally by an inwardly-directed field-plate 27. A part of the thick ductile metal layer pattern (either part 50a or part 50b, depending on the location around the perimeter) extends over the termination structure 26,27 while being spaced by a distance Z3 from the periphery 11 of the chip 10. This spacing of the layer pattern 50 from the chip periphery 11 is important in ensuring that smearing of the ductile metal during thermal cycling does not cause a short-circuit to the silicon bulk 12 of the chip 10. For the same reason, it is also beneficial to extend the insulating over-layer 40 into the scribing lane 15 where the semiconductor wafer was scribed into the individual device chips. The layer part 50a or 50b terminates a distance Z4 (of several micrometers; for example 5 micrometers) from the edge of the scribing lane 15. In a typical example, Z3 may be about 20 or 30 micrometers.

FIG. 4 also illustrates a further advantageous feature wherein a part 37 of the conductor pattern 30 extends between the termination scheme 26,27 and the overlying part 50a,50b of the ductile metal layer pattern 50 to screen electrically the termination scheme 26,27 from this overlying part 50a,50b. In the example of FIG. 4, the part 37 of the conductor pattern 30 is connected to the inner field plate 26.

The isolated parts of the layer pattern 50 can be formed easily and cheaply in the manufacture of a device in accordance the invention, for example with standard device processing. The formation of the layer pattern 50 is compatible with forming other features such as bond pads and test pads in the same process steps. It is also easier to implement in a high-volume manufacturing context than the application of a soft rubber or other organic coating on the chip. These other solutions are expensive as they have to be applied individually to each chip after chip-bonding and wire-bonding. By contrast therewith, metal layer deposition and patterning (for example, stencil-masking or etching technologies) may be used to provide the layer pattern 50 on a semiconductor wafer before dividing the wafer into its individual chips 10. Although the bond pads 51 and test pads 52 could be formed by parts of the conductor pattern 30 at windows 41 in the insulating over-layer 40, it is advantageous to form them and the layer pattern 50 from a common layer of ductile metal. This permits advantageous manufacture of a device in accordance with the invention.

In summary, there is disclosed an advantageous device structure and its manufacture, wherein measures are taken to reduce stress effects during thermal cycling and to reduce charging effects during operation, in relation to the underlying conductor pattern and the insulating over-layer 40 of a chip 10 encapsulated in a plastics package 100.

These measures involve covering the surface of the insulating overlayer 40 with a thick soft metal layer pattern 50 (normally aluminium is most convenient). In this covering 50, a small isolation spacing Z1 is present between the isolated parts. The soft metal acts as a ductile yielding interface that protects the insulating overlayer 40 from interaction with the plastics material 100. Although not electrically functional, the separate parts of this soft metal layer pattern 50 can be connected to a convenient potential to avoid charging effects. Deposition (or plating) and patterning of the ductile metal can be carried out in the same process steps as used for the metal bond pad areas 51. The electrically isolated parts 50a to 50f, bond pads 51 and any other conductive areas 52 at the top of the chip 10 are separated by a sufficient margin Z1 to make allowance for any deformation (shearing and smearing) caused by the relative movement of chip 10 and plastic 100 during thermal cycling.

Aluminium or at least an aluminium-based alloy is most conveniently used for the layer pattern 50, as it is a standard deposition material in semiconductor device manufacture. However, other ductile metals can be used for the layer 50, for example, lead. Plating the top conductive areas 50 and 51 of a chip 10 with lead can be particularly useful with, for example, soldered terminal connections to bond pads 51.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A semiconductor device comprising a semiconductor chip (10) encapsulated in an envelope of synthetic resin material (100), wherein an insulating layer (20) is present at one surface of the chip (10), a pattern (30) of conductive connections (31–39) is present on the insulating layer (20) and at windows (21) in the insulating layer, an over-layer (40) of substantially brittle insulating material is present on the pattern (30) of conductive connections, and a layer pattern (50) is formed of ductile metal to cover at least most of the surface area of the over-layer (40) of insulating material to provide an interface with the synthetic resin material (100) that reduces stress between the insulating material and the synthetic resin material during thermal cycling of the semiconductor device, and wherein the ductile metal layer pattern (50) comprises distinct parts (50a, 50b, 50c, 50d, etc.) that are electrically isolated and spaced from each other on the over-layer (40), the ductile metal of layer pattern (50) is sufficiently ductile as to deform laterally on the over-layer (40) during thermal cycling of the semiconductor device, and the spacing (21) of the electrically-isolated parts (50a, 50b, 50c, 50d, etc.) is sufficient to avoid a short circuit between the electrically-isolated parts as a result of the lateral deformation.

2. A device as claimed in claim 1, wherein the spacing of the electrically-isolated parts of the ductile metal layer pattern is at least 15 micrometers in the device before thermal cycling.

3. A device as claimed in claim 1, wherein the semiconductor chip comprises integrated circuitry, and at least one of the electrically-isolated parts of the ductile metal layer pattern extends over the over-layer over conductive connections of the integrated circuitry.

4. A device as claimed in claim 1, wherein the semiconductor chip comprises integrated circuitry that includes a capacitor, a window is present in the over-layer at the area of the capacitor where a part of the pattern of conductive connections forms an upper plate of the capacitor, and at least one of the electrically-isolated parts of the ductile metal layer pattern extends on the upper plate of the capacitor at the window in the over-layer.

5. A device as claimed in claim 1, wherein a number of the electrically-isolated parts of the ductile metal layer pattern form metal bond pads that are connected to the conductive connections at windows in the over-layer, and terminal conductors of the device are connected to the metal bond pads.

6. A device as claimed in claim 1, wherein at least one part of the ductile metal layer pattern is connected to the same potential as an underlying conductive area.

7. A device as claimed in claim 6, wherein distincts parts of the ductile metal layer pattern that are electrically isolated from each other are individually connected to respective underlying conductive areas.

8. A device as claimed in claim 7, wherein the device body comprises a power-dissipating portion and an integrated circuit portion, a part of the ductile metal layer pattern overlies the power-dissipating portion and is connected to an underlying conductive area of the power-dissipating portion, and at least one other part of the ductile metal layer pattern overlies the integrated circuit portion and is connected to an underlying conductive area of the integrated circuit portion.

9. A device as claimed in claim 1, wherein the semiconductor chip comprises a perimeter termination structure in the vicinity of the periphery of the semiconductor chip, and a part of the ductile metal layer pattern extends over the termination structure while being spaced from the periphery of the semiconductor chip.

10. A device as claimed in claim 9, wherein a part of the pattern of conductive connections extends between the termination scheme and the overlying part of the ductile metal layer pattern to screen electrically the termination scheme from the overlying part of the ductile metal layer pattern.

11. A device as claimed in claim 1, wherein the ductile metal layer pattern covers at least 90% of the surface area of the over-layer of insulating material.

12. A device as claimed in claim 1, wherein the ductile metal layer pattern has a thickness of at least 2.5 micrometers.

13. A device as claimed in claim 1, wherein the ductile metal layer is aluminum or an aluminum alloy.

14. A device as claimed in claim 1, wherein the ductile metal layer pattern (50) is formed having a thickness greater than a height variation in a corrugated surface of the over-layer (40) of insulating material.

* * * * *